(12) United States Patent
van Veldhoven

(10) Patent No.: US 11,502,698 B1
(45) Date of Patent: Nov. 15, 2022

(54) DUAL LOOP PASSIVE SIGMA-DELTA MODULATOR

(71) Applicant: NXP B.V., Eindhoven (NL)

(72) Inventor: Robert van Veldhoven, Valkenswaard (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/398,391

(22) Filed: Aug. 10, 2021

(51) Int. Cl.
    *H03M 3/00* (2006.01)
(52) U.S. Cl.
    CPC .................... *H03M 3/322* (2013.01)
(58) Field of Classification Search
    CPC ........................................ H03M 3/322
    USPC ................................. 341/118–160
    See application file for complete search history.

(56) References Cited

U.S. PATENT DOCUMENTS

| | | | | |
|---|---|---|---|---|
| 6,930,624 B2* | 8/2005 | Hezar | ................... | H03M 3/322 341/143 |
| 8,818,761 B2* | 8/2014 | Klabunde | ................. | H03F 1/56 333/172 |
| 2005/0116850 A1* | 6/2005 | Hezar | ................... | H03M 3/322 341/143 |
| 2005/0162222 A1* | 7/2005 | Hezar | ..................... | H03F 3/217 330/10 |
| 2006/0044057 A1* | 3/2006 | Hezar | ................... | H03F 3/2173 330/10 |
| 2009/0224954 A1* | 9/2009 | Balachandran | ......... | H03M 3/32 341/158 |
| 2011/0050471 A1* | 3/2011 | Kumar | .................. | H03M 3/368 341/143 |
| 2019/0363730 A1* | 11/2019 | Erol | ........................ | H03M 3/46 |

OTHER PUBLICATIONS

Nowacki, Blazej et al. "A Low Power 4th Order MASH Switched-Capacitor ΣΔ Modulator Using Ultra Incomplete Settling." IEEE Xplore 2014. pp. 1344-1347. Downloaded on Jan. 4, 2021 from IEEE Xplore.
Nowacki, Blazej et al. "A 1V 77dB-Dr 72dB-SNDR 10MHz-BW 2-1 MASH CT ΔΣM" 2016 IEEE International Solid-State Circuits Conference Session 15. pp. 274-276.
Nowacki, Blazej et al. "A Third-Order Mash ΣΔ Modulator Using Passive Integrators." IEEE Transactions on Circuits and Systems-1: Regular Papers. vol. 64, No. 11, Nov. 2017. pp. 2871-2883.
Benabes, Philippe et al. "Passive Sigma-Delta Converters Design." IEEE Instrumentation and Measurements ©2002 IEEE pp. 469-474.

* cited by examiner

*Primary Examiner* — Lam T Mai

(57) ABSTRACT

A passive sigma-delta modulator including first modulator loop, a second modulator loop, and a digital combiner providing an output signal. The first modulator loop includes a first quantizer, a first passive summing junction, a first continuous-time passive analog loop filter, and a first feedback path. The second modulator loop includes a second quantizer, analog transfer circuitry, a second continuous-time passive summing junction, a second passive analog loop filter, a second feedback path, and digital transfer circuitry having a gain that is substantially a reciprocal of the analog transfer circuitry. A digital noise cancelation filter may be located between the first quantizer and the digital combiner, or an analog noise cancelation filter may be provided within the second modulator loop. Single-ended or differential configurations are contemplated.

20 Claims, 12 Drawing Sheets

US 11,502,698 B1

DUAL LOOP PASSIVE SIGMA-DELTA MODULATOR

BACKGROUND

Field of the Invention

The present invention relates in general to sigma-delta converters, and more particularly to a dual loop passive sigma-delta converter with reduced size and power consumption and reduced design time.

Description of the Related Art

Sigma-delta ($\Sigma\Delta$) converters, including analog-to-digital converters (ADC), typically include a single loop. In traditional $\Sigma\Delta$ converters, the loop may include at least one active summing junction and one or more integrators designed with active circuitry, each having very high gain at low frequencies. Passive sigma delta converters work slightly different. Instead of implementing the summing junction(s) and integrator(s) with active circuitry, these components are implemented only with passive components. The advantage is that passive circuits use a very limited amount of power or no power at all, but this is achieved at the cost of not having gain. To improve the performance of a single loop passive $\Sigma\Delta$ converter, it is possible to reduce the poles further and further. In this manner, the input signal to the quantizer gets smaller and therefore its gain becomes larger. Unfortunately, however, there is a practical limit to pole reduction. As the signal gets weaker and weaker, the modulator becomes more sensitive to comparator input noise and metastability. A possible solution is to increase the current in the comparator, but this could result in excessive increase in the comparator size and power consumption. One conventional approach to increase the performance of $\Sigma\Delta$ converters is a MASH structure that converts the quantization error of a first loop by using a second modulator. The MASH approach, however, uses significant active circuitry at the cost of increased size and power. Also, the MASH configuration requires a compensation filter which needs complicated calibration typically performed by trial and error.

BRIEF DESCRIPTION OF THE DRAWINGS

Embodiments of the present invention are illustrated by way of example and are not limited by the accompanying figures. Similar references in the figures may indicate similar elements. Elements in the figures are illustrated for simplicity and clarity and have not necessarily been drawn to scale.

DETAILED DESCRIPTION

A dual loop passive sigma-delta ($\Sigma\Delta$) modulator according to embodiments described herein avoids substantial use of active circuitry to reduce size, power consumption, and design time. The dual loop passive $\Delta\Sigma$ modulator includes a first passive loop with a first quantizer having first quantization noise. The dual loop passive $\Delta\Sigma$ modulator also includes a second passive loop that is configured to convert the first quantization error and add it to the output of the first loop to effectively cancel the first quantization error. Although the second loop also includes a quantizer with second quantization node, the second loop further includes transfer circuitry that performs transfer functions configured to reduce and minimize the second quantization error. The term "passive" as used herein with reference to a $\Sigma\Delta$ modulator is intended to mean that the summing junction(s), integrator(s) and loop filter(s) are implemented using passive components only, in which other circuitry, such as comparators and amplifiers, may be implemented with active circuitry. For simplicity of drawing in each of the following figures, the elements and components are shown with single inputs and single outputs, where it is understood that in practice, many of the components, such as quantizers, amplifiers, comparators, etc., may have two inputs or two outputs. In addition, any of the embodiments described herein may be implemented as single-ended configurations or differential configurations. The signals for differential configurations may have a positive polarity and a negative polarity. Components having two inputs or two outputs in a single-ended configuration may have one of the input or output signals coupled to a reference voltage, such as ground or the like.

Figure 1:
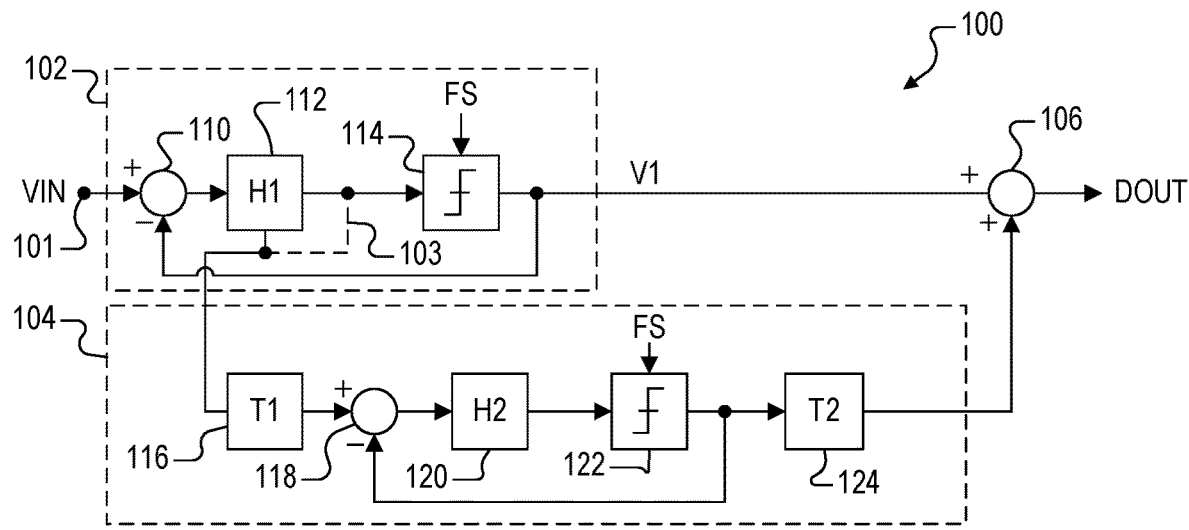
FIGS. 1 and 2 are simplified block diagrams of a passive sigma-delta ($\Sigma\Delta$) modulator configured as an analog-to-digital converter (ADC) implemented according to an embodiment of the present disclosure.

FIG. 1 is a simplified block diagram of a passive ΣΔ modulator 100 configured as an analog-to-digital converter (ADC) implemented according to an embodiment of the present disclosure. The ΔΣ modulator 100 includes a first modulator loop 102, a second modulator loop 104, and a digital combiner 106. The first modulator loop 102 includes a first passive summing junction 110, a first passive loop filter 112 with a transfer function H1, and a first quantizer 114 receiving a sample frequency signal FS. The second modulator loop 104 includes analog transfer circuitry 116 with a transfer function T1, a second passive summing junction 118, a second passive loop filter 120 with a transfer function H2, a second quantizer 122 receiving FS, and digital transfer circuitry 124 with a transfer function T2. The first and second passive summing junctions 112 and 120 and the first and second passive loop filters 112 and 120 may be implemented with passive devices. In the illustrated embodiments, the first and second passive loop filters may also be implemented as continuous-time filters avoiding the use of switching devices. The term "continuous-time" is intended to mean that the modulator is always on with continuous operation and without using switched-capacitor circuitry. The first and second quantizers 114 and 122 may be implemented with clocked comparators that are clocked using the FS signal. The analog transfer circuitry and the digital transfer circuitry 116 and 124 may be implemented with a combination of amplifiers, attenuators, and filters to achieve desired transfer functions as further described herein.

An input node 101 receiving an analog input signal VIN is coupled to one input of the passive summing junction 110, having an output coupled to an input of the loop filter 112. The loop filter 112 has an output coupled to an input of the quantizer 114, which has an output providing a digital output signal V1 that is provided to one input of the digital combiner 106 and that is fed back to a negative input of the summing junction 110. The digital combiner 106 has an output providing a digital output signal DOUT. The digital combiner 106 is depicted as a digital adder. The analog transfer circuitry 116 is shown having an input that is coupled to the loop filter 112, which includes the output of the loop filter 112 as indicated by connection 103 illustrated with a dashed line. The analog transfer circuitry 116 has an output coupled to one input of another passive summing junction 118, which has an output coupled to an input of the loop filter 120. The loop filter 120 has an output coupled to an input of the quantizer 122, which has an output that is coupled to an input of the digital transfer circuitry 124 and that is fed back and coupled to a negative input of the summing junction 118. The digital transfer circuitry 124 has an output coupled to another input of the digital combiner 106.

Figure 2:
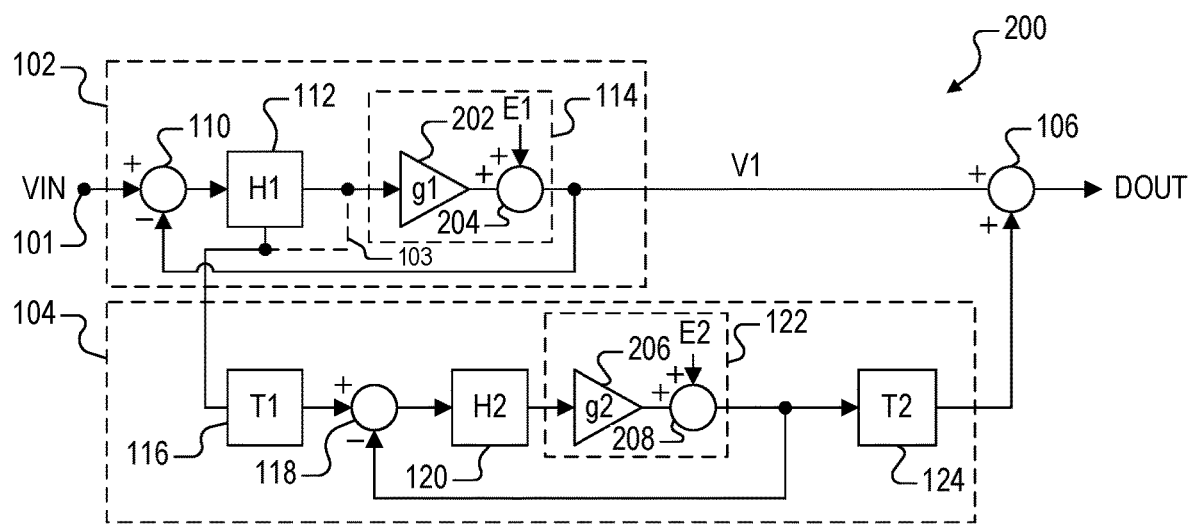

FIG. 2 is a simplified block diagram of a passive ΣΔ modulator 200 also implemented according to an embodiment of the present disclosure. The ΣΔ modulator 200 is substantially the same as the ΣΔ modulator 100 in which substantially the same components assume identical reference numbers including the first modulator loop 102, the second modulator loop 104, and the digital combiner 106.

The quantizers 114 and 122 are each replaced with (or otherwise modeled by) a gain and a summing node according to a known linearization method. In particular, the quantizer 114 is replaced by an amplifier 202 with gain g1 and a summing junction 204, and the quantizer 122 is replaced by an amplifier 206 with gain g2 and a summing junction 208. The amplifier 202 has an input coupled to the output of the loop filter 112 and has an output coupled to one input of the summing junction 204. The summing junction 204 has another input receiving a quantization error E1 and has an output providing V1. Similarly, the amplifier 206 has an input coupled to the output of the loop filter 120 and has an output coupled to one input of the summing junction 208. The summing junction 208 has another input receiving a quantization error E2 and has an output coupled to the input of the digital transfer circuitry 124.

In a conventional ΣΔ modulator or converter in which the second modulator loop 104 is not included, the transfer function H1 is usually constructed with at least one integrator or a cascade of integrators each having very high gain at low frequencies. The quantizer gain g1 is often close to 1. Therefore, it can be concluded that the input signal VIN transfers directly to the output DOUT at low frequencies, while the quantization error E1 is shaped by the loop filter H1. Passive ΣΔ modulators work differently. Instead of implementing the summing nodes and integrator(s) with active circuitry, they are implemented only with passive components. At least one advantage is that passive circuits use a limited amount of power since active circuitry is reduced. The cost of passive circuitry is that the gain is limited. H1, for example, generally has a gain of 1 at low frequencies. In order to reject the quantization error E1 in the signal band, therefore, the gain has to come from the quantizer gain g1. To enable this, the loop filter 112 is a passive filter with poles at low frequencies compared to the clock frequency. The loop filter 112 filters the error signal coming from the summing node, and intentionally reduces the signal swing at the input of the quantizer 114, which in this case is a 1-bit quantizer. Because the input signal VIN to the quantizer 114 is reduced, and because the output swing of the quantizer 114 remains the same, such as, for example, could be +1 and −1, its gain has increased. Because of the passive filter roll-off at high frequencies, the loop gain constructed by g1 and H1, at high frequencies is reduced, and the quantization error E1 is rejected less and less. In this manner quantization noise in the signal band is made low, but increases at higher frequencies due to diminishing loop gain.

The second modulator loop 104 converts the quantization error E1 of the first loop and adds it to the output of the first. In this manner the quantization error E1 of the first modulator loop 102 may be effectively canceled by being converted to the digital domain and added back to the digital output of the first modulator loop 102. The second modulator loop 104, however, also introduces the quantization noise E2. The transfer functions T1 and T2 are configured to reduce the effect of the quantization noise E2. T1 and T2 can each be a combination of amplifiers, attenuators and filters configured to reduce E1 and E2 as much as possible to improve the in-band quantization noise. In one embodiment, the transfer function T1 is configured according to following equation (1):

$$T1 = \frac{1 + H2(g2)}{H2(g2)} A \qquad (1)$$

and the transfer function T2 is configured according to the following equation (2):

$$T2 = \frac{1}{A} \quad (2)$$

so that the output DOUT is according to the following equation (3):

$$DOUT = VIN + E2\left(\frac{1}{A(1+H2g2)}\right) \quad (3)$$

From the transfer function of VIN to DOUT, it is seen that VIN appears at the output effectively unfiltered and unattenuated, that the quantization error E1 is effectively canceled, and that the quantization error E2 is not only shaped by H2, but is also attenuated by a factor of A. If the signal bandwidth of interest is low compared to the bandwidth of H2, then H2(g2)>>1 so that T1 can be reduced to A. By adding an additional (passive) filter in T1, the quantization error E1 from the first modulator loop 102 is reduced further. This reduces the signal swing coming from the first modulator loop 102, and therefore allows for A to be increased, which suppresses the quantization error E2 further while achieving an even better signal-to-noise ratio (SNR). In this manner, performance of a ΔΣ modulator with a single passive modulator loop can be greatly improved by adding a second passive modulator loop and summing the outputs of each.

In case the signal bandwidth of interest is high compared to the bandwidth of H2, T1 might not be simplified to A only as described above, as this would lead to imperfect cancellation of E1 in the signal bandwidth, and the Signal-to-Quantization-Noise (SQNR) is reduced. At least in the signal bandwidth T1 should be accurate to enable cancellation of E1, and a noise cancellation filter (NCF) may be used. T1 has a high pass function with a very high gain at high frequencies, which can be implemented with passive circuits as further described herein.

Another approach is to move the (1+H2g2)/(H2g2) part in T1 to T2, which is in the digital domain. In this case, VIN at DOUT is unfiltered and unattenuated, E1 is canceled, E2 is shaped by H2 and attenuated by A introduced in T1 and T2, and filtered by (1+H2g2)/(H2g2). The most relevant part of (1+H2g2)/(H2g2) is the low frequency part where it is desired to cancel E1. At low frequencies (1+H2g2)/(H2g2) reduces to T1=1/A and T2=A. At high frequencies, E1 is not completely cancelled, but this is also not always needed in a low pass ΔΣ modulator. Anyway, at high frequencies E2 increases because of the nature of the loop and perfect cancellation of E1 may not be necessary. As described further herein, a noise cancelation filter (NCF) may be added such as a digital NCF (NCF$_D$) 308 after the first modulator loop 102 as shown in in FIG. 3 or an analog NCF (NCFA) 408 provided before or within the second modulator loop 104 as shown in FIG. 4. The NCF D 308 may filter out of band quantization noise of the first modulator loop 102 and relax the requirements of a decimation filter. In one embodiment, the transfer function of an NCF D is 1/T2.

Figure 3:
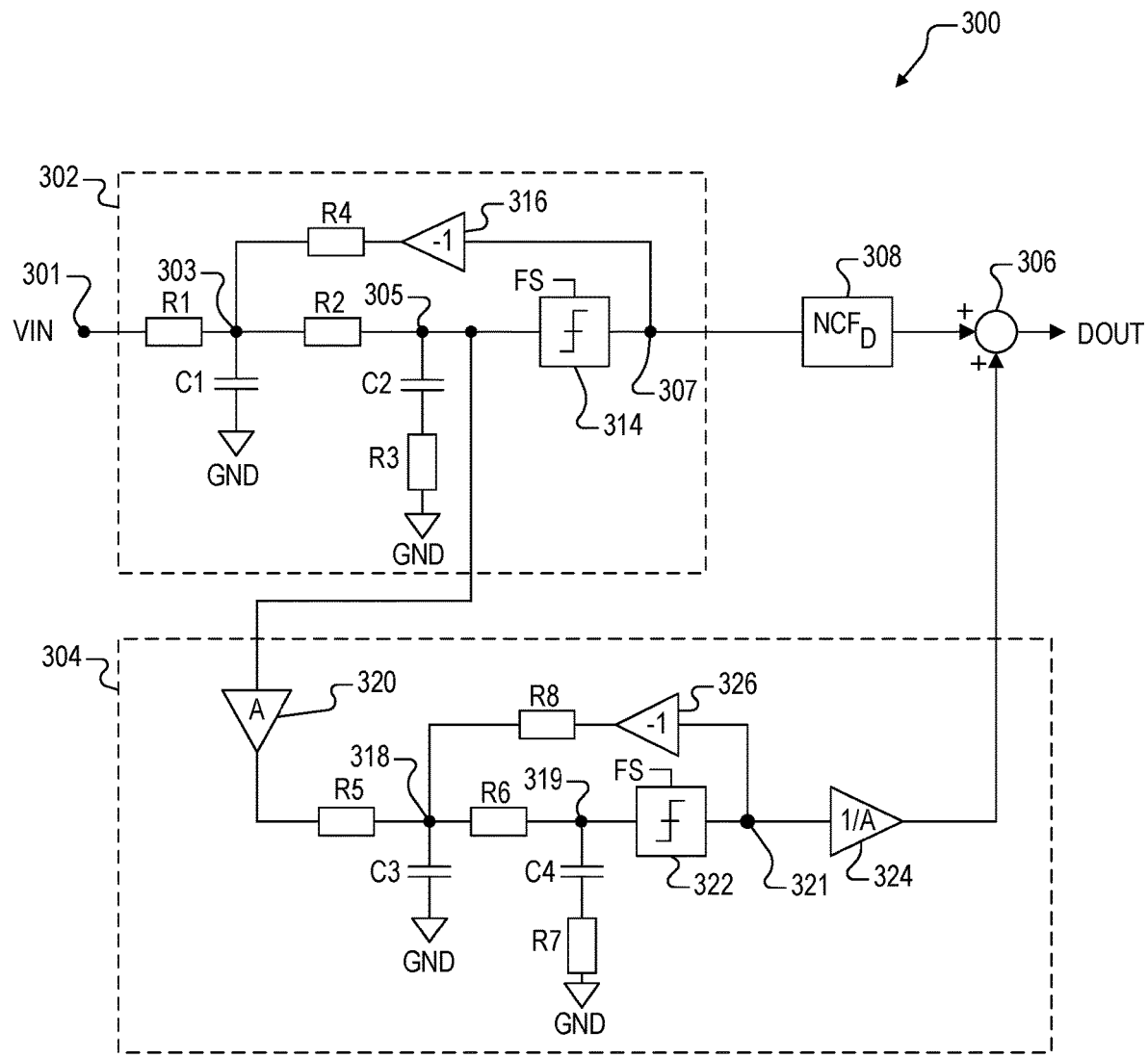
FIG. 3 is a more specific schematic diagram of a passive $\Delta\Sigma$ modulator implemented according to one embodiment of the present disclosure using a digital noise cancelation filter.
Figure 4:
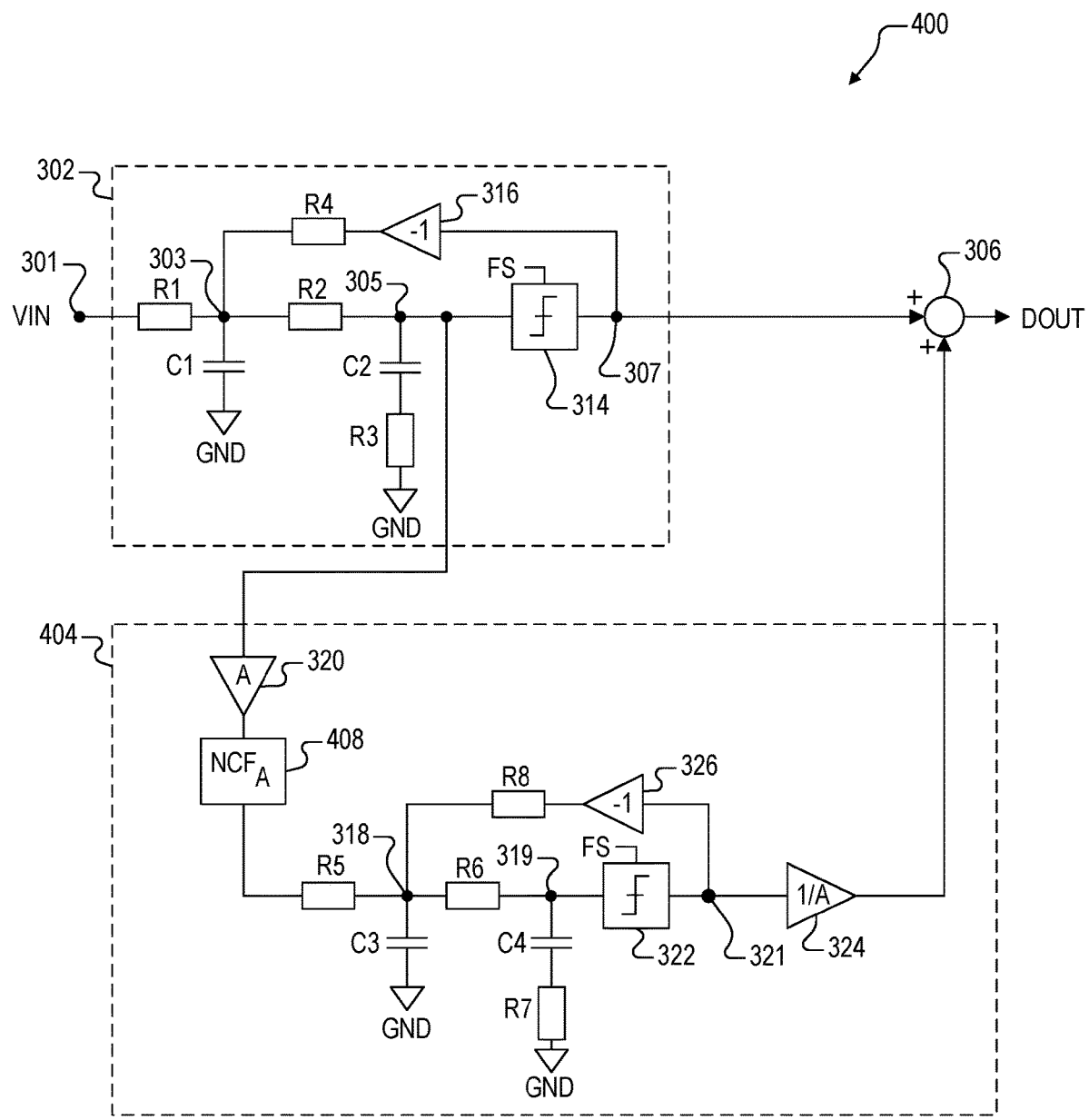
FIG. 4 is another more specific schematic diagram of a passive $\Delta\Sigma$ modulator implemented according to another embodiment of the present disclosure similar to that shown in FIG. 3 except using an analog noise cancelation filter rather than a digital noise cancelation filter.

FIG. 3 is a more specific schematic diagram of a passive ΔΣ modulator 300 implemented according to one embodiment of the present disclosure. The ΔΣ modulator 300 includes a first modulator loop 302, a second modulator loop 304, a digital combiner 306, and the NCF D 308. An input node 301 receiving an analog input signal VIN is coupled to one terminal of a resistor R1, having its other terminal coupled to a passive summing junction 303. A capacitor C1 is coupled between the summing junction 303 and a supply voltage reference node, such as ground (GND). GND is used as the supply voltage reference node in each of the illustrated embodiments, although alternative reference voltages are contemplated. A resistor R2 has one terminal coupled to the summing junction 303 and another terminal coupled to a node 305 which is further coupled to an input of a first quantizer 314. A capacitor C2 has a first terminal coupled to node 305 and a second terminal coupled to a first terminal of a resistor R3, which has its other terminal coupled to GND. The quantizer 307 has an output coupled to a node 307, which is further coupled to an input of an inverting amplifier 316 and to an input of the NCF$_D$ 308. The inverting amplifier 316 has an output coupled a first terminal of a resistor R4, which has a second terminal coupled to the summing junction 303. The NCF$_D$ 308 has an output coupled to one input of the digital combiner 306.

The second modulator loop 304 includes an amplifier 320 with gain A having an input coupled to node 305 and having an output coupled to one terminal of a resistor R5. R5 has a second terminal coupled to a passive summing junction 318, which is further coupled to a first terminal of each of resistors R6 and R8 and a capacitor C3. The other terminal of C3 is coupled to GND, and the other terminal of R6 is coupled to a node 319 which is further coupled to an input of a quantizer 322 and to a first terminal of a capacitor C4. C4 has a second terminal coupled to a first terminal of a resistor R7, which has its other terminal coupled to GND. The quantizer 322 has an output coupled to a node 321, which is further coupled to an input of an amplifier 324 with a gain of 1/A and to an input of another inverting amplifier 326. The first and second inverting amplifiers 316 and 326 may each be implemented simply as an inverter or the like. The inverting amplifier 326 has an output coupled to the second terminal of the resistor R8. The amplifier 324 has an output coupled to a second input of the digital combiner 306, which has an output providing DOUT.

In comparison with the passive ΔΣ modulators 100 and 200 of FIGS. 1 and 2, the transfer function H1 is implemented with a first resistor-capacitor (RC) stage including resistor R1 and capacitor C1 and a second RC stage including resistors R2 and R3 and capacitor C2. The passive summing junction 110 is configured as the resistively-coupled summing junction 303 so that it is effectively incorporated within the transfer function H1. In a similar manner, the transfer function H2 is implemented with a first RC stage including resistor R5 and capacitor C3 and a second RC stage including resistors R6 and R7 and capacitor C4. The passive summing junction 118 is configured as the resistively-coupled summing junction 318 so that it is effectively incorporated within the transfer function H2. In this case, the second modulator loop 304 is coupled to the first modulator loop 304 at node 305, which is effectively the output of the first transfer function H1.

The quantizers 314 and 322 may each be implemented as a clocked comparator in similar manner as the quantizers 114 and 122, in which each comparator outputs a digital 1 or −1 depending upon its input at the rate of FS. The inverting amplifiers 316 and 326 invert the quantizer outputs and converts to analog voltages applied to the feedback resistors R4 and R8 (or other loop circuitry depending upon the embodiment as further described herein) forming a digital-to-analog converter (DAC) function. In one embodiment, the common-mode voltage is usually about halfway between the supply voltage range, so that the DAC function produces half the supply on average as well. When the inverting amplifiers 316 and 326 are implemented as inverters, each inverter may be connected between GND and a reference voltage to provide an average DAC output about in the middle of the reference voltage range.

If the $NCF_D$ 308 is omitted or otherwise if its gain is set to 1 (e.g., bypassed), then the second modulator loop 304 still provides an improvement of the SNR. In one specific embodiment, an improvement of about 5 decibels (dB) of the SNR may be achieved over a single-loop passive modulator by including the second modulator loop 304 without the $NCF_D$ 308. However, the compensation only works for a very limited bandwidth because of the absence of an NCF. Nonetheless, in some applications this might be sufficient.

To further improve performance and extent operating frequency range, the gain of the $NCF_D$ 308 is adjusted to achieve a significant SQNR improvement in applicable frequencies. In this case, the cancellation works up to higher frequencies, enabling application of this architecture for higher bandwidth ADC applications. An advantage of using the $NCF_D$ 308 is that it already also partly filters the out of band quantization noise, which relaxes the requirements of a decimator. In one specific embodiment, an additional improvement of about 9 dB of the SNR may be achieved using the $NCF_D$ 308, for a total of about 14 dB as compared to a single loop passive modulator. A potential challenge of using the $NCF_D$ 308 is that its coefficients match the analog filter coefficients. As these can spread by a significant amount, such as, for example, +/−30% in certain configurations, calibration may be required.

FIG. 4 is another more specific schematic diagram of a passive ΔΣ modulator 400 implemented according to another embodiment of the present disclosure. The first modulator loop 302 is included in similar manner as the passive ΔΣ modulator 300. The passive ΔΣ modulator 400 is substantially similar to the passive ΔΣ modulator 300 except that the $NCF_D$ 308 is removed (so that node 307 is directly coupled to one input of the digital combiner 306) and the second modulator loop 304 is replaced by a second modulator loop 404 in which an analog noise cancelation filter (NCFA) 408 is inserted or otherwise located between the output of the amplifier 320 and R5. As compared to the matching challenge of the digital filter, analog components can be designed such that matching is significantly better, such as, for example, as much as 1% or better, which may be sufficiently accurate for most configurations. It is noted that the transfer function of the NCFA 408 is the reciprocal of the transfer function of the $NCF_D$ 308, which may be represented as $NCFA=1/NCF_D$. The mapping of poles and zeros between the digital and analog NCF for example can be done by using the bilinear transform.

Compared to the passive ΔΣ modulator 300 configuration using the $NCF_D$ 308, the performance of the passive ΔΣ modulator 400 not only did not degrade, it improved. In one specific embodiment, an improvement of an additional 4 dB of the SNR is achieved using the NCFA 408 as compared to the $NCF_D$ 308, for a total of about 18 dB as compared to a single loop passive modulator.

Figure 5:
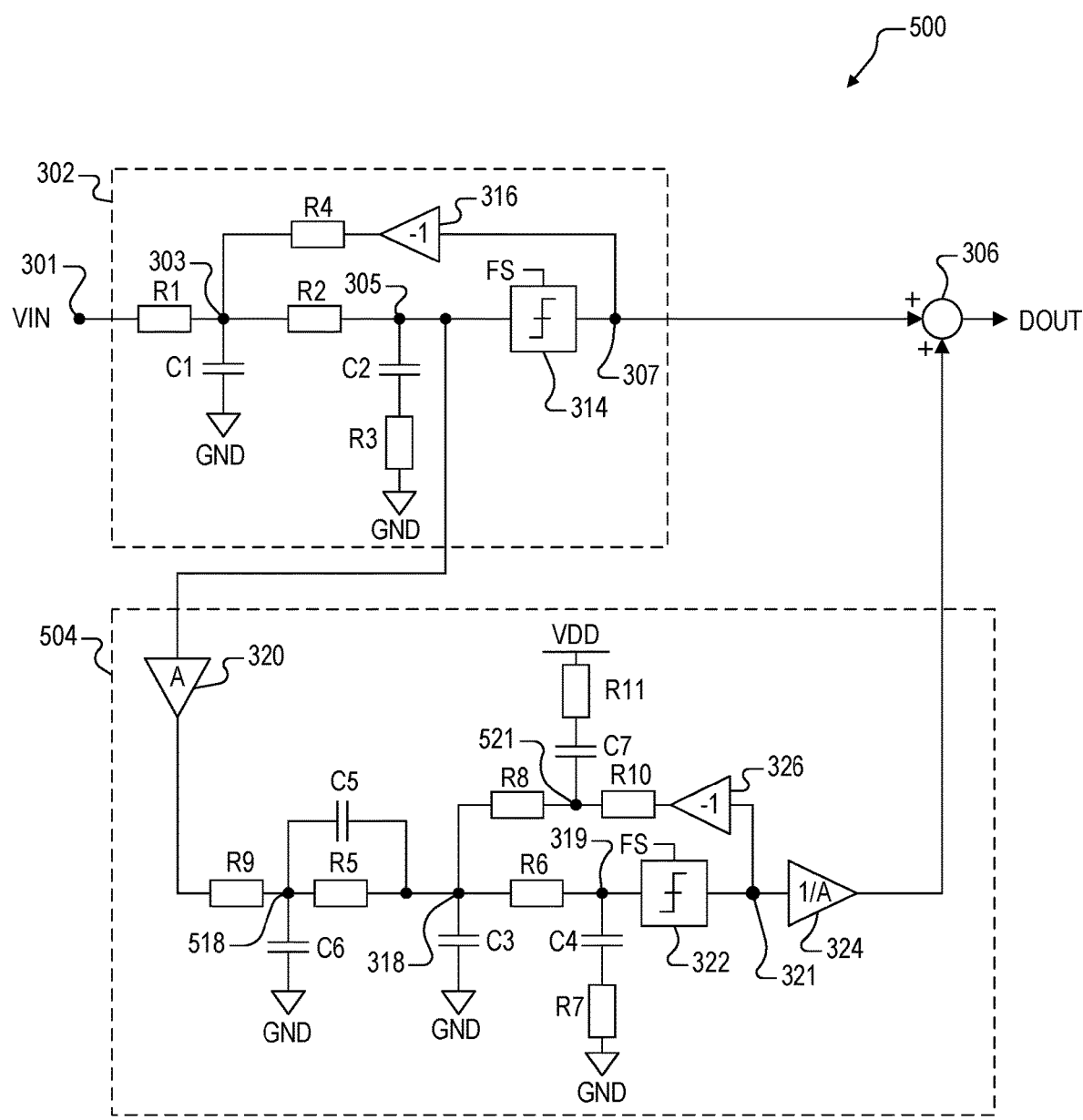
FIG. 5 is another more specific schematic diagram of a passive $\Delta\Sigma$ modulator implemented according to another embodiment of the present disclosure illustrating a more specific implementation of the analog noise cancelation filter of FIG. 4.

FIG. 5 is another more specific schematic diagram of a passive ΔΣ modulator 500 implemented according to another embodiment of the present disclosure. The passive ΔΣ modulator 500 is a more specific implementation of the passive ΔΣ modulator 400 in which the NCFA 408 is implemented by adding resistors R9, R10 and R11 and by adding capacitors C5, C6, and C7 in a second modulator loop 504 replacing the second modulator loop 404. The first modulator loop 302 and the digital combiner 306 are included and coupled in similar manner. R9 has a first terminal coupled to the output of the amplifier 320 and a second terminal coupled to a node 518 which is coupled to the first terminal of the resistor R5. C5 is coupled in parallel with R5 between nodes 518 and 318, and C6 is coupled between node 518 and GND. R10 has a first terminal coupled to the output of the inverting amplifier 326 and a second terminal coupled to a node 521, which is further coupled to one terminal of R8 and to a first terminal of C7. C7 has a second terminal coupled to a first terminal of R11, which has a second terminal coupled to a supply voltage node receiving a supply voltage shown as VDD.

The combination R5 and C5 create one of the zeros needed for the NCFA. The second zero is implemented by C7. C5 creates a zero in the signal transfer function of the second modulator loop 504 as it increases the input-output gain of the second modulator loop 504 at higher frequencies. C7 basically reduces the feedback signal coming from the digital to analog converter (DAC) of the second modulator loop 504, which also increases the input-output gain of the second modulator loop 504. This creates a zero in the signal transfer function of the second modulator loop 504 as desired. To avoid excessive gain of the quantization noise of the first modulator loop 302 (which could cause overload of the second modulator loop 504), the original R5 is split in R5 and R9. Thus, at low frequencies the input resistor of the second modulator loop 504 is formed by R5+R9, at high frequencies this is R9 only. This avoids the input impedance (formerly known as R5 only) becoming "0" at high frequencies, where the minimum value of this input resistor is set to R9. This also avoids the quantization noise of the first modulator loop 302 overloading the second modulator loop 504. R11 is used to avoid the signal transfer function becoming larger and larger at high frequencies to avoid overload due to the excessive amplification of the quantization noise of the first modulator loop 302. Also, R11 can be used to stabilize the second modulator loop 504. In addition, C6 may be added to reduce the quantization noise E1 coming from the first modulator loop 302. It is noted that in another embodiment (not shown), the amplifier 320 could have been used in part to implement the NCFA 408.

In one specific embodiment, an improvement of a total of about 21 dB of SNR is achieved as compared to a single loop passive modulator. This is because the digital NCF is an approximation of the analog NCF. The analog NCF may be better suited to compensate for the analog loop filtering of the quantization noise E1 of the first modulator loop 302. The digital NCF may be a z-transformed approximation of the analog NCF.

Figure 6:
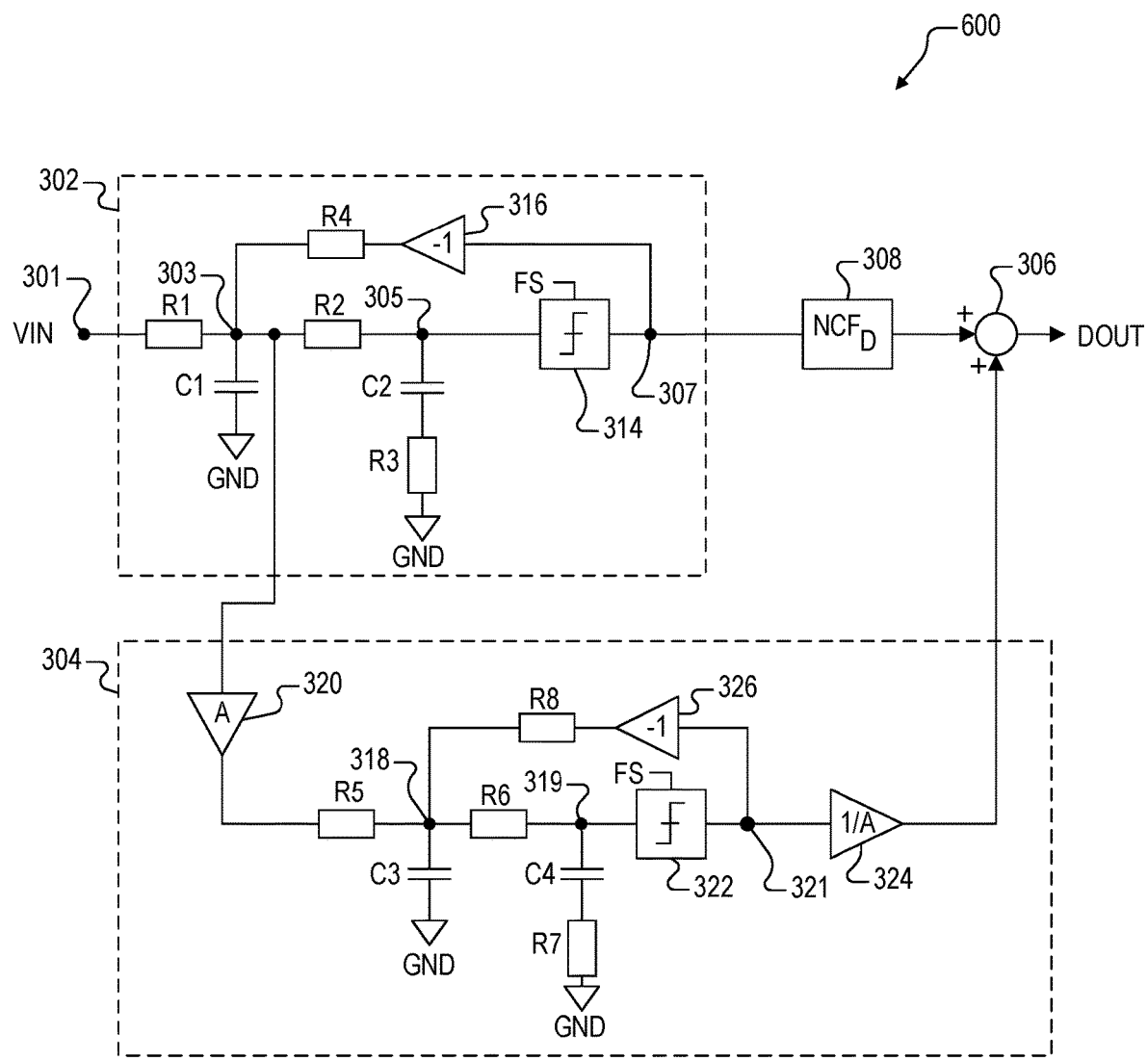
FIG. 6 is a more specific schematic diagram of a passive $\Delta\Sigma$ modulator implemented according to one embodiment of the present disclosure similar to that shown in FIG. 3 except with the second modulator loop coupled within the first transfer function of the first modulator loop.

FIG. 6 is a more specific schematic diagram of a passive ΔΣ modulator 600 implemented according to one embodiment of the present disclosure. The passive ΔΣ modulator 600 is substantially similar to the passive ΔΣ modulator 300 and also includes the first modulator loop 302, the second modulator loop 304, the digital combiner 306, and the NCF D 308. The input of the amplifier 320, however, is coupled to the summing junction 303 rather than node 305, and thus within the first transfer function H1. The passive ΔΣ modulator 600 has a distinct advantage in that the noise of R2, like the comparator noise and the quantization noise of first modulation loop 302 is now also rejected by the second modulator loop 304. Since R2 usually is (much higher) than R1 to avoid excessive loading on the first RC stage, this change can provide a significant SNR improvement. It is noted that if the input of second modulator loop 304 is taken from the first RC filter of the first modulator loop 302, then the NCF D 308 should be corrected, compared to the case where the input of the second modulator loop 304 is taken from the second RC filter of the first modulator loop 302.

In a more specific configuration, the passive ΔΣ modulator 600 can provide an SNR improvement of about 5 dB as compared to the passive ΔΣ modulator 300. The passive ΔΣ modulator 600 thus provides an SNR improvement of about 10 dB without the NCF D 308 and an SNR improvement of about 18 dB with the NCF D 308 as compared to a single-loop passive ΔΣ modulator.

Figure 7:
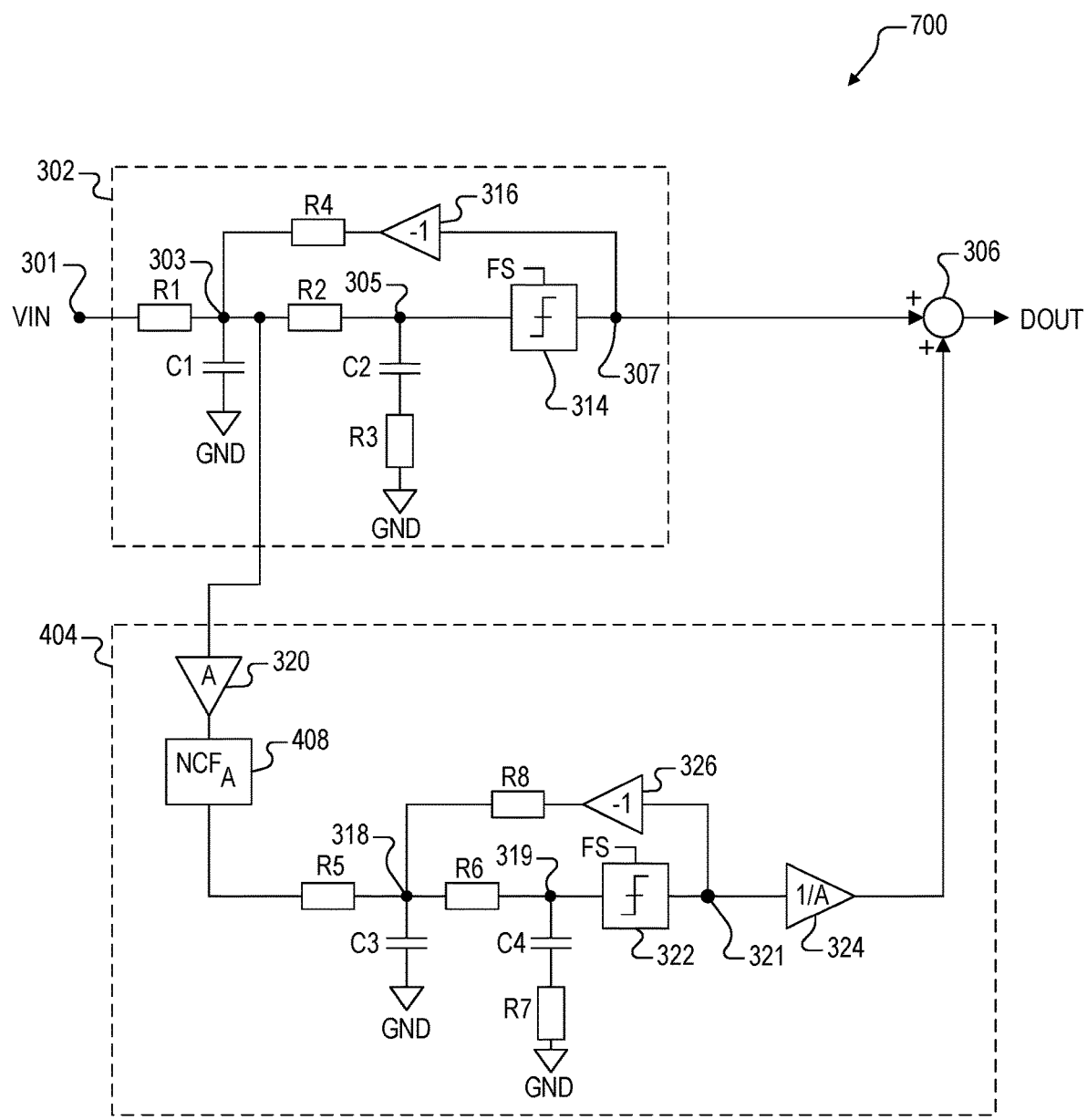
FIG. 7 is a more specific schematic diagram of a passive $\Delta\Sigma$ modulator implemented according to one embodiment of the present disclosure similar to that shown in FIG. 4 except with the second modulator loop coupled within the first transfer function of the first modulator loop.

FIG. 7 is a more specific schematic diagram of a passive ΔΣ modulator 700 implemented according to one embodiment of the present disclosure. The passive ΔΣ modulator 700 is substantially similar to the passive ΔΣ modulator 400 and also includes the first modulator loop 302, the second modulator loop 404 including the NCFA 408, and the digital combiner 306. The input of the amplifier 320, however, is coupled to the summing junction 303 rather than node 305 and thus within the first transfer function H1.

In a more specific configuration, the passive ΔΣ modulator 700 can provide an SNR improvement of about 1 dB as compared to the passive ΔΣ modulator 400. The passive ΔΣ modulator 700 thus provides an SNR improvement of about 19 dB as compared to a single-loop passive ΔΣ modulator.

Figure 8:
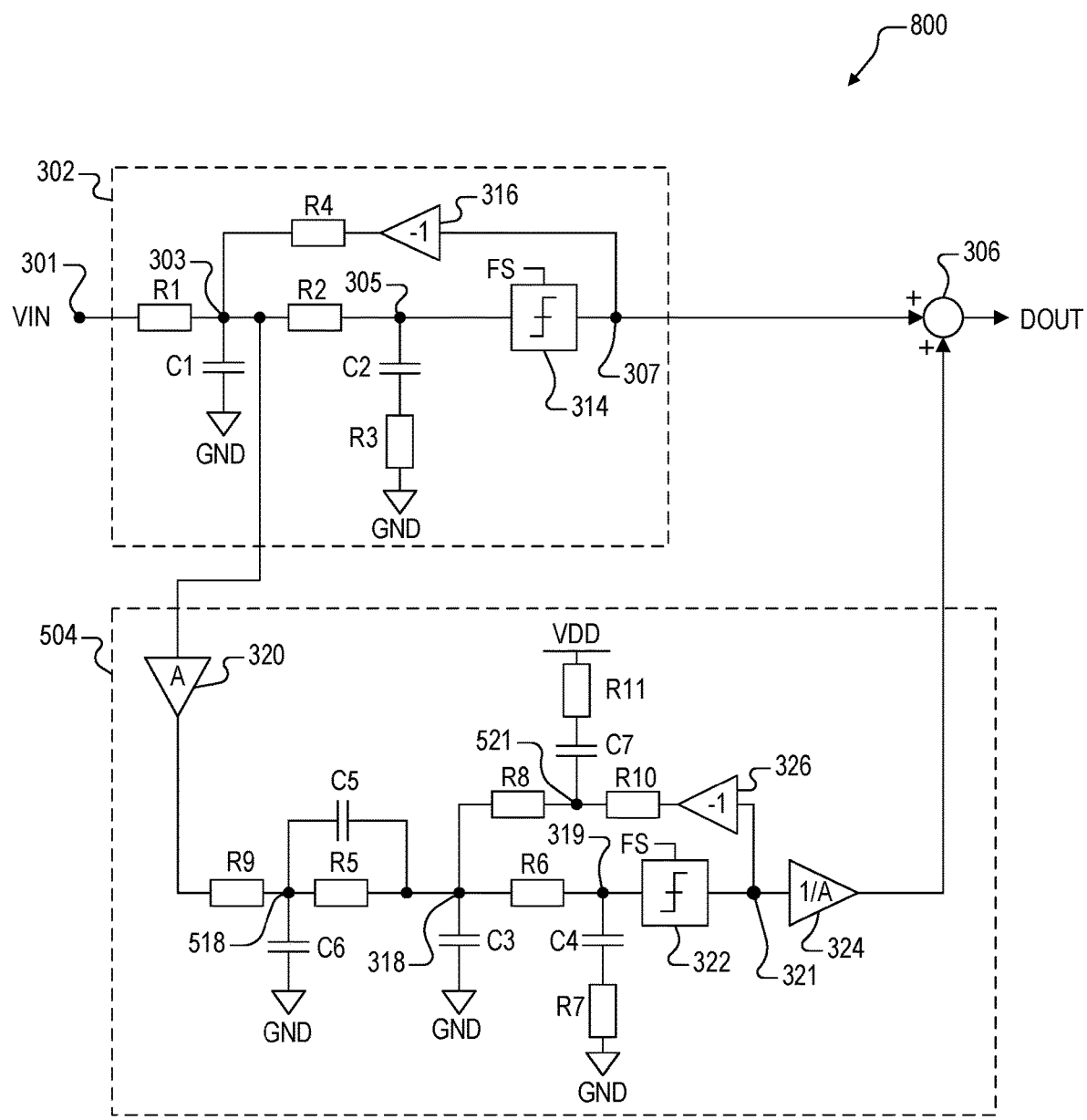
FIG. 8 is a more specific schematic diagram of a passive $\Delta\Sigma$ modulator implemented according to one embodiment of the present disclosure similar to that shown in FIG. 5 except with the second modulator loop coupled within the first transfer function of the first modulator loop.

FIG. 8 is a more specific schematic diagram of a passive ΔΣ modulator 800 implemented according to one embodiment of the present disclosure. The passive ΔΣ modulator 800 is substantially similar to the passive ΔΣ modulator 500 and also includes the first modulator loop 302, the second modulator loop 504, and the digital combiner 306. The input of the amplifier 320, however, is coupled to the summing junction 303 rather than node 305 and thus within the first transfer function H1. Again, the NCFA 408 is implemented by adding resistors R9, R10 and R11 and by adding capacitors C5, C6, and C7 in a second modulator loop 504 replacing the second modulator loop 404. It is noted that because the quantization noise E1 at the output of the first modulator loop 302 is now only filtered by the first RC stage in the first modulator loop 302 before being passed to the second modulator loop 504, one less zero is needed in the NCFA 408. Therefore, the zero can be implemented through either C5 or C7.

In a more specific configuration, the passive ΔΣ modulator 800 can provide an SNR improvement of about 1 dB as compared to the passive ΔΣ modulator 500. The passive ΔΣ modulator 800 thus provides an SNR improvement of about 21 dB as compared to a single-loop passive ΔΣ modulator.

Figure 9:
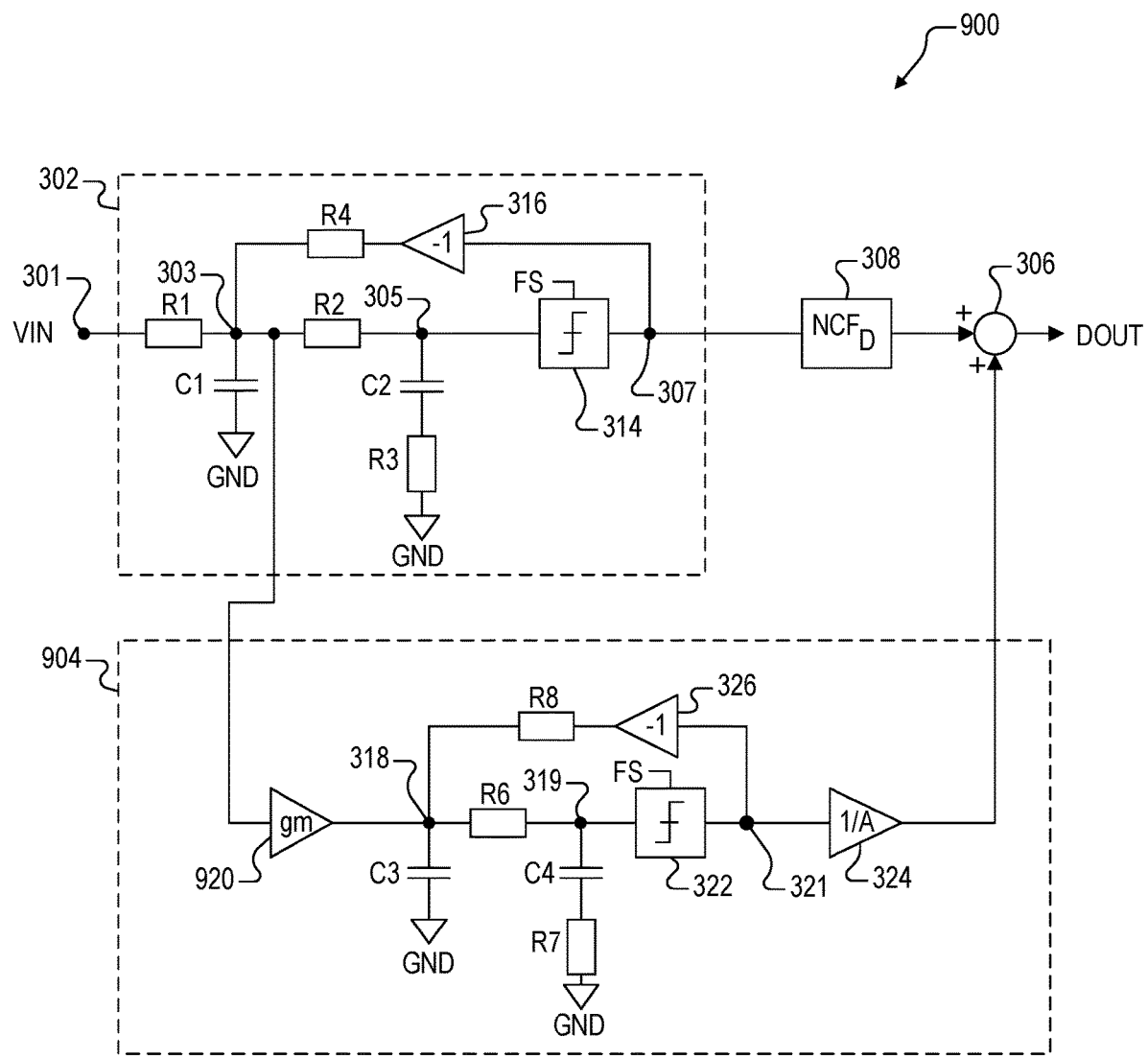
FIG. 9 is a more specific schematic diagram of a passive $\Delta\Sigma$ modulator implemented according to one embodiment of the present disclosure similar to that shown in FIG. 6 except using a transconductance amplifier.

FIG. 9 is a more specific schematic diagram of a passive ΔΣ modulator 900 implemented according to one embodiment of the present disclosure. When compared to the passive ΔΣ modulator 600, the passive ΔΣ modulator 900 includes the first modulator loop 302, a second modulator loop 904, the digital combiner 306, and the $NCF_D$ 308, in which the second modulator loop 904 replaces the second modulator loop 304. Within the second modulator loop 904, the amplifier 320 and the resistor R5 of the second modulator loop 304 are replaced by a transconductance amplifier 920, in which the transconductance amplifier 920 has an input coupled to the summing node 303 and an output coupled to the node 318. The transconductance amplifier 920 has a transconductance gain gm which may be set equal to A/R5, in which A is the gain of the amplifier 320 and R5 denotes the resistance of the resistor R5.

The passive ΔΣ modulator 900, without the $NCF_D$ 308, provides an SNR improvement of about 7 dB relative to a single-loop ΔΣ modulator, which is about 3 dB less than the passive ΔΣ modulator 600 without the $NCF_D$ 308. When the $NCF_D$ 308 is included and optimized, an additional SNR improvement of about 8 dB—9 dB may be achieved for a total of about 15 dB-16 dB relative to a single-loop ΔΣ modulator.

Figure 10:
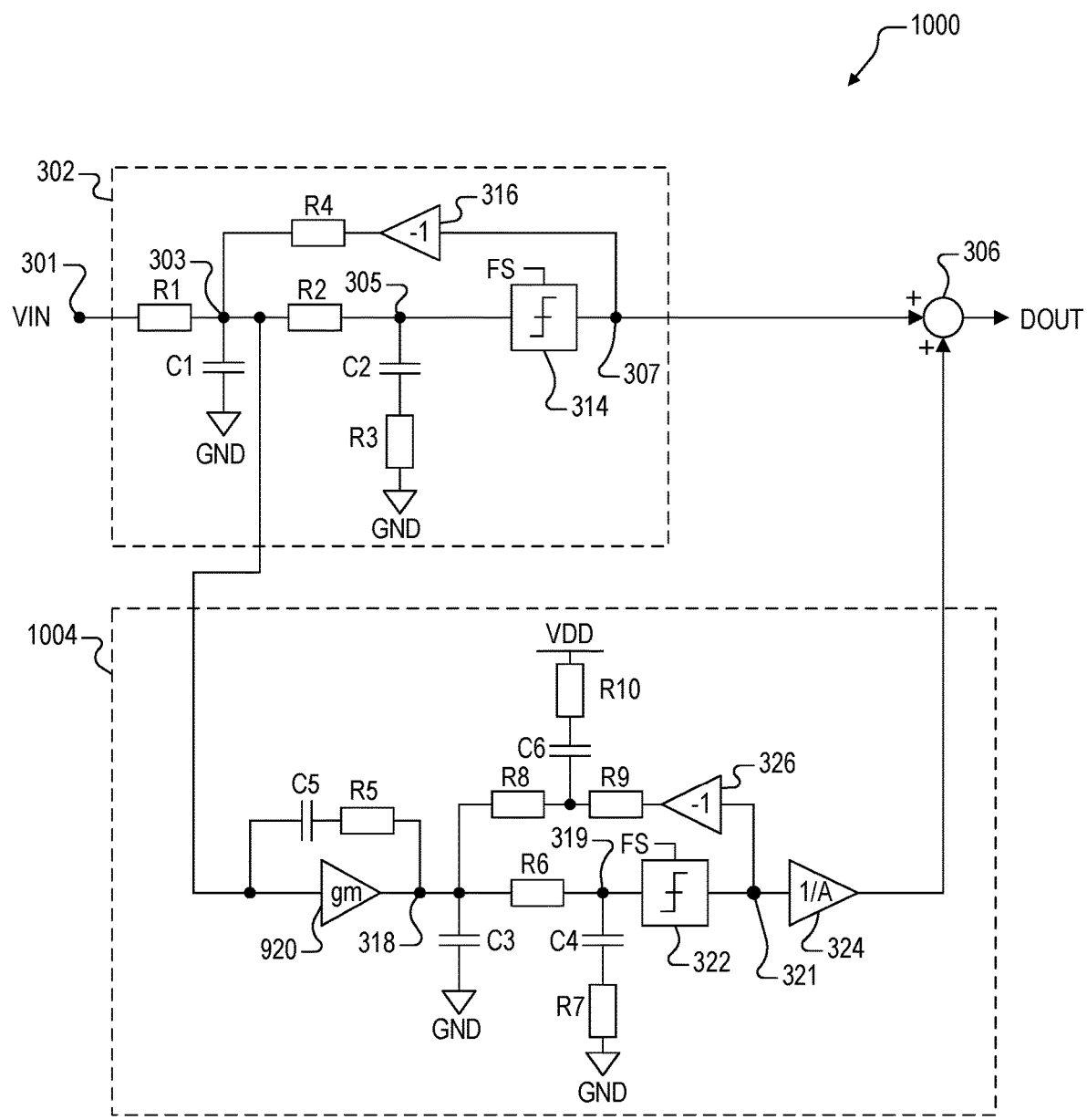
FIG. 10 is a more specific schematic diagram of a passive $\Delta\Sigma$ modulator implemented according to one embodiment of the present disclosure similar to that shown in FIG. 9 except without the digital noise cancelation filter and including a specific embodiment of an analog noise cancelation filter.

FIG. 10 is a more specific schematic diagram of a passive ΔΣ modulator 1000 implemented according to one embodiment of the present disclosure. As compared to the passive ΔΣ modulator 900, the passive ΔΣ modulator 1000 omits the $NCF_D$ 308 and the second modulator loop 904 is replaced by a second modulator loop 1004. The second modulator loop 1004 includes the transconductance amplifier 920 and further includes resistors R5, R9 and R10 and capacitors C5 and C6 to essentially form an analog NCF.

The passive ΔΣ modulator 1000 may provide an SNR improvement of about 24 dB relative to a single-loop ΔΣ modulator. When the $NCF_D$ 308 is included and optimized, an additional SNR improvement of about 8 dB—9 dB may be achieved for a total of about 15 dB-16 dB relative to a single-loop ΔΣ modulator.

In an alternative embodiment of the passive ΔΣ modulator 1000, the input of the transconductance amplifier 920 may be coupled to node 305, which is effectively the output of the second RC stage of the first modulator loop 302.

An alternative to including the transconductance amplifier 920 with a transconductance gm of A/R5, or to including the amplifier 320 with gain A, is to increase the resistance value of R8. Increasing R8 effectively gives the second modulator loop a gain from its input to its output. In case of the amplifier 320 and R5 configuration, R8 can be set to A*R5, setting the gain of the second modulator loop to A, so that the amplifier 320 can be replaced by a simple buffer.

For the second modulator loop including the transconductance amplifier 920, the transconductance gm can be set to 1/R5, and R8 can be set to A*R5, which sets the gain of the second modulator loop 904 to A. The configuration does not need a buffer as the transconductance stage already has a high ohmic input, and does not significantly load the first modulator loop 302.

Figure 11:
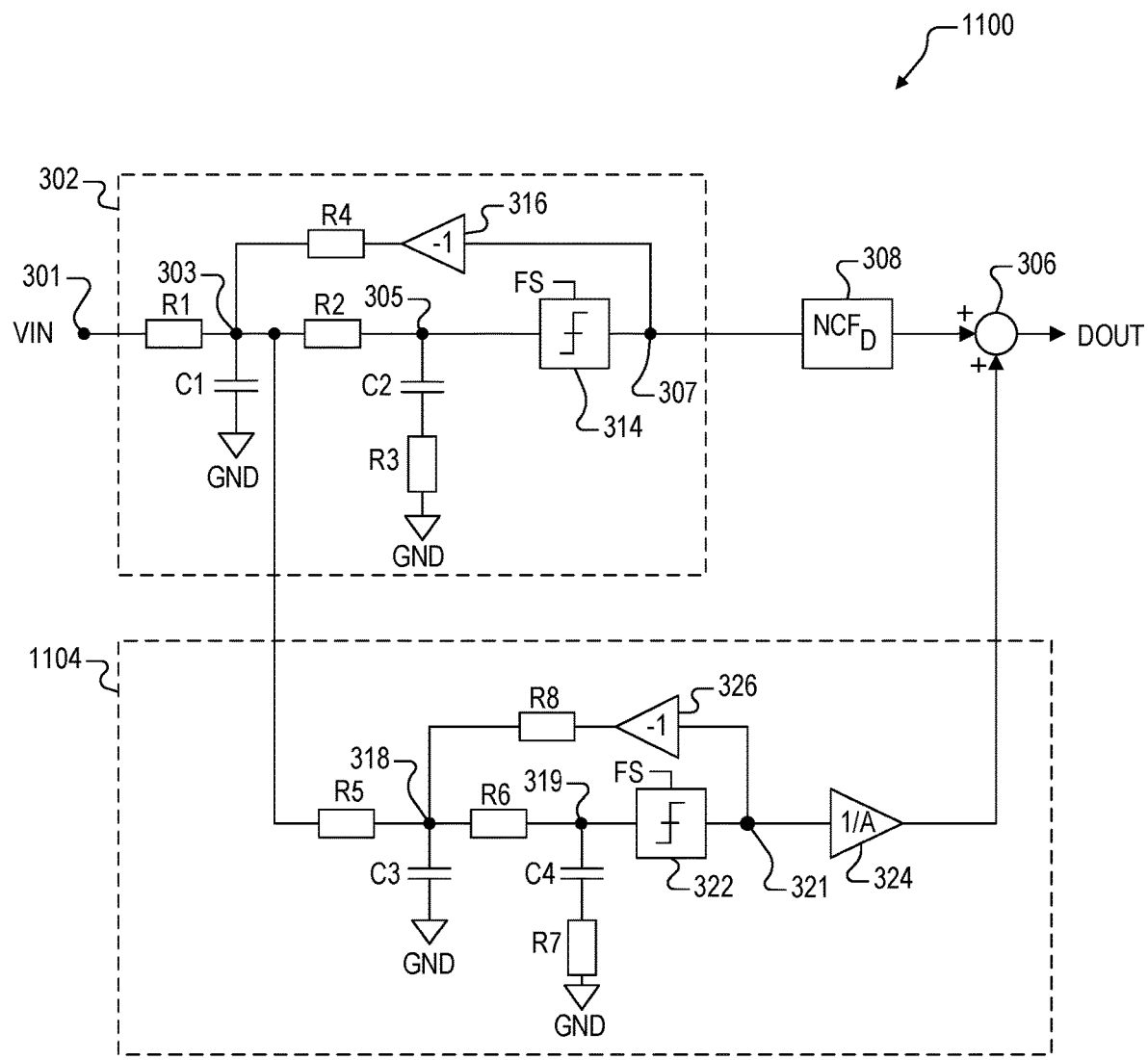
FIG. 11 is a more specific schematic diagram of a passive $\Delta\Sigma$ modulator implemented according to one embodiment of the present disclosure similar to that shown in FIG. 6 except excluding an amplifier in the second modulator loop.

FIG. 11 is a more specific schematic diagram of a passive ΔΣ modulator 1100 implemented according to one embodiment of the present disclosure. The passive ΔΣ modulator 1100 is similar to the passive ΔΣ modulator 600 except that the second modulator loop 304 is replaced by a second modulator loop 1104 that does not include the amplifier 320 or any other type of amplifier, such as the transconductance amplifier 920. In this manner, the input of the second modulator loop 1104 directly loads the summing junction 303 within the first modulator loop 302. When the load of R5 becomes large, load compensation should be done.

A simulation result of the passive ΔΣ modulator 1100 with load compensation but without the $NCF_D$ 308 provides an SNR improvement of about 11 dB-13 dB. A simulation result of the passive ΔΣ modulator 1100 with load compensation and with the $NCF_D$ 308 adjusted to reduced the quantization noise E1 of the first modulator loop 302 provides an SNR improvement of about 27 dB to 29 dB.

Figure 12:
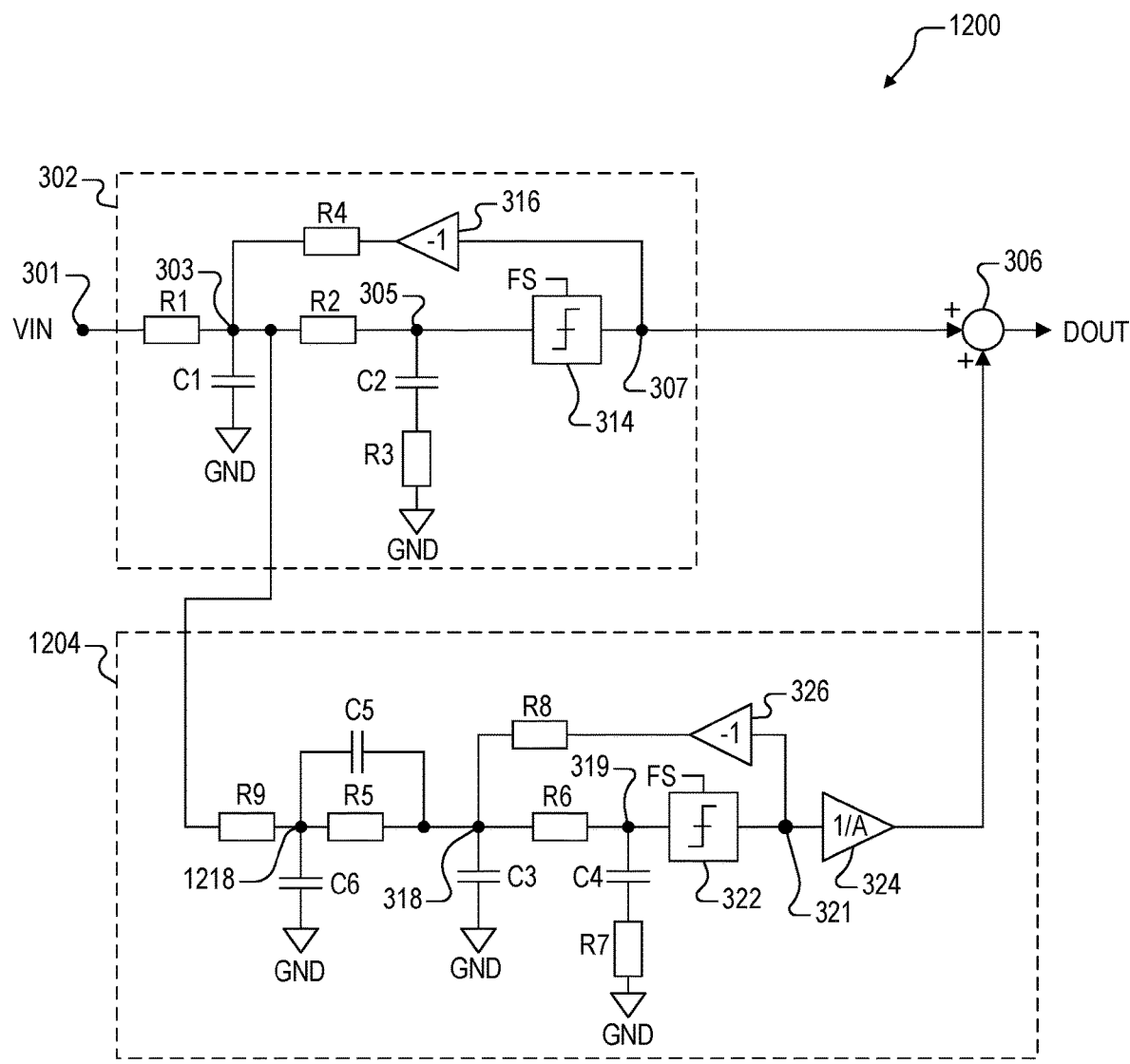
FIG. 12 is a more specific schematic diagram of a passive $\Delta\Sigma$ modulator implemented according to one embodiment of the present disclosure similar to that shown in FIG. 11 except that the digital noise cancelation filter is removed and a specific embodiment of an analog noise cancelation filter is added.

FIG. 12 is a more specific schematic diagram of a passive ΔΣ modulator 1200 implemented according to one embodiment of the present disclosure. The passive ΔΣ modulator 1200 is similar to the passive ΔΣ modulator 1100, except that the $NCF_D$ 308 is removed and replaced by components forming an analog NCF in a second modulator loop 1204. As compared to the second modulator loop 1104, the second modulator loop 1204 includes an additional resistor R9 and additional capacitors C5 and C6. R9 has a first terminal directly coupled to the summing node 303 of the first modulator loop 302, and has a second terminal coupled to a node 1218 which is coupled to the first terminal of the resistor R5. C6 is coupled between node 1218 and GND and C5 is coupled in parallel with R5 between nodes 1218 and 318.

For the passive ΔΣ modulator 1200, C5 creates a zero in the signal transfer function, and R9 creates a pole to avoid overloading the first modulator loop 302. A second zero in R8 is not used because the output of the first RC stage of the first modulator loop 302 is used as the input of the second modulator loop 1204. In one embodiment, the sum of resistances of the resistors R9 and R5 is about four times the resistance of the resistor R1 to avoid excessive loading. In addition, the resistance of R8 divided by the resistive sum of R5 and R9 is set equal to the gain A to ensure that the quantization noise E2 of the quantizer 322 is sufficiently below the quantization noise E1 of the quantizer 314. The capacitors are adjusted accordingly.

In one embodiment of the passive ΔΣ modulator 1200, the only active circuits are the two comparators implementing the quantizers 314 and 322. The remaining circuitry only uses switches that are used in the DAC feedback paths, along with resistors, capacitors, or digital circuits. It is noted that the inverting amplifiers 316 and 326 may each be implemented with simple inverters. This makes this ADC modulator very easy to design, saving a lot of design effort, design time and cost. In one simulation result, an SNR improvement of about 27 dB was achieved relative to a single-loop modulator. This is true for implementations that were not designed to squeeze SQNR to the limit. If sufficient margin is kept, the architecture is extremely robust to RC spread. If resonators are used in the loop filter, these might require calibration unless the resonator zeros are positioned such that even in worst case RC spread, the SQNR is still sufficient.

Figure 13:
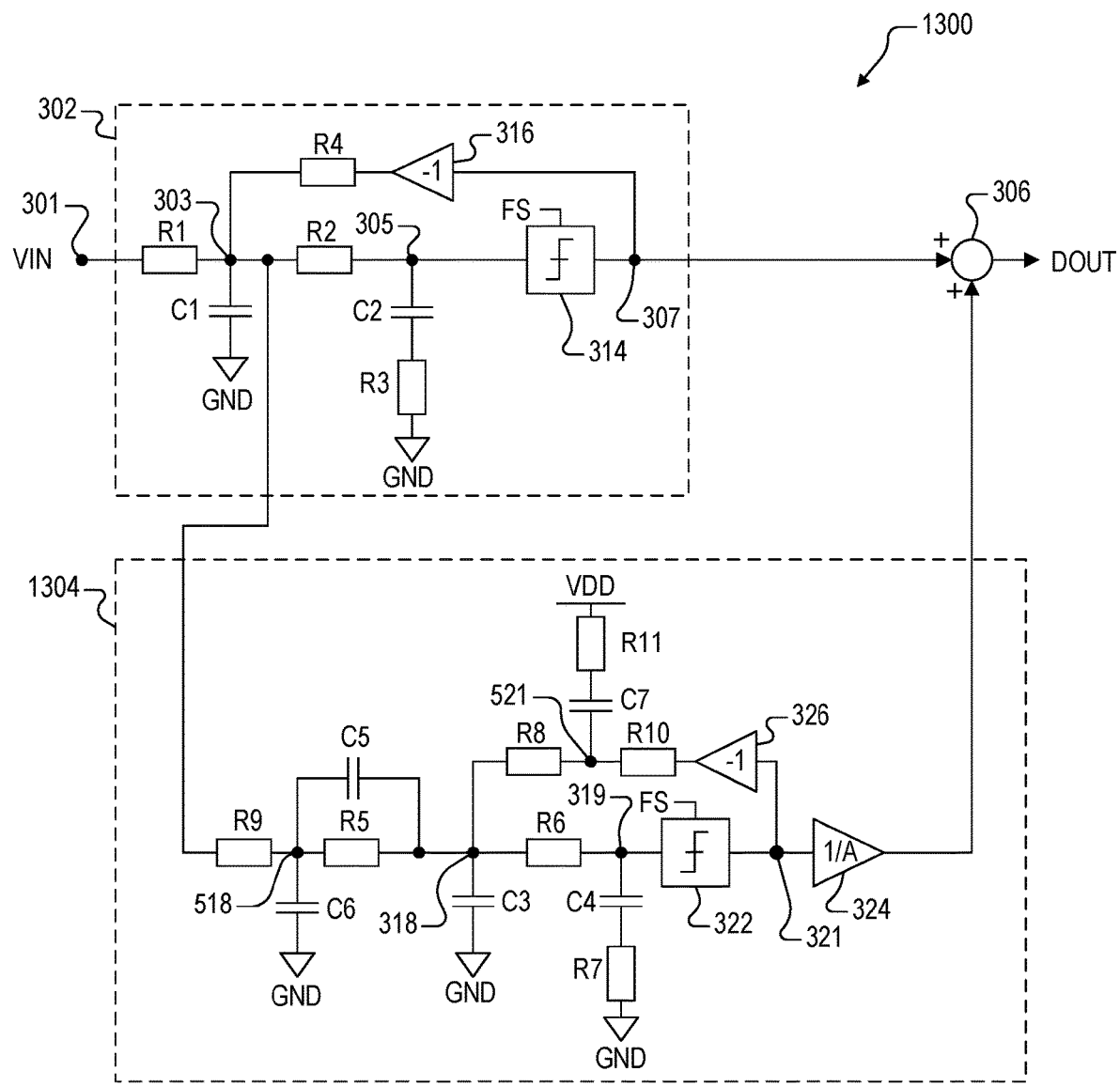
FIG. 13 is a more specific schematic diagram of a passive $\Delta\Sigma$ modulator implemented according to one embodiment of the present disclosure similar to the passive $\Delta\Sigma$ modulator shown in FIG. 8, except excluding an amplifier in the second modulator loop.

FIG. 13 is a more specific schematic diagram of a passive ΔΣ modulator 1300 implemented according to one embodiment of the present disclosure. The passive ΔΣ modulator 1300 is similar to the passive ΔΣ modulator 800 in which the NCFA is simplified in similar manner, except that the second modulator loop 504 is replaced by a second modulator loop 1304 that does not include the amplifier 320 or any other type of amplifier in a similar manner as the passive ΔΣ modulators 1100 and 1200.

Although the present invention has been described in connection with several embodiments, the invention is not intended to be limited to the specific forms set forth herein. On the contrary, it is intended to cover such alternatives, modifications, and equivalents as can be reasonably included within the scope of the invention as defined by the appended claims. For example, variations of positive circuitry or negative circuitry may be used in various embodiments in which the present invention is not limited to specific circuitry polarities, device types or voltage or error levels or the like. For example, circuitry states, such as circuitry low and circuitry high may be reversed depending upon whether the pin or signal is implemented in positive or negative circuitry or the like. In some cases, the circuitry state may be programmable in which the circuitry state may be reversed for a given circuitry function.

The terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A passive sigma-delta modulator, comprising:
   a first modulator loop, comprising:
      a first quantizer having an input and having an output;
      a first passive summing junction and a first continuous-time passive analog loop filter coupled between an input node and the input of the first quantizer; and
      a first feedback path coupled between the output of the first quantizer and the first passive summing junction;
   a second modulator loop, comprising:
      a second quantizer having an input and having an output;
      analog transfer circuitry, a second continuous-time passive summing junction, and a second passive analog loop filter coupled in series between the first continuous-time passive analog loop filter and the input of the second quantizer;
      a second feedback path coupled between the output of the second quantizer and the second passive summing junction; and
      digital transfer circuitry having an input coupled to the output of the second quantizer and having an output, wherein the digital transfer circuitry has a gain that is substantially a reciprocal of the analog transfer circuitry; and
   a digital combiner having a first input coupled to the output of the first quantizer, having a second input coupled to the output of the digital transfer circuitry, and having an output providing an output.

2. The passive sigma-delta modulator of claim 1, further comprising a digital noise cancelation filter located between the output of the first quantizer and the first input of the digital combiner.

3. The passive sigma-delta modulator of claim 1, further comprising an analog noise cancelation filter located between the output of the analog transfer circuitry and the second analog summing junction.

4. The passive sigma-delta modulator of claim 1, wherein the first and second modulator loops comprise differential circuitry.

5. The passive sigma-delta modulator of claim 1, wherein the first modulator loop comprises:
   a first resistor coupled between the input node and the first passive summing junction;
   a first capacitor coupled between the first passive summing junction and a supply voltage reference node;
   a second resistor coupled between the first passive summing junction and the input of the first quantizer;
   a second capacitor having a first terminal coupled to the input of the first quantizer and having a second terminal;
   a third resistor coupled between the second terminal of the second capacitor and the supply voltage reference node;
   a first inverting amplifier having an input coupled to the output of the first quantizer and having an output; and
   a fourth resistor coupled between the output of the first inverting amplifier and the first passive summing junction.

6. The passive sigma-delta modulator of claim 5, further comprising:
- a digital noise cancelation filter located between the output of the first quantizer and the first input of the digital combiner; and
- wherein the second modulator loop comprises:
  - an analog amplifier having an input coupled to the input of the first quantizer and having an output;
  - a fifth resistor coupled between the output of the analog amplifier and the second passive summing junction;
  - a third capacitor coupled between the second passive summing junction and the supply voltage reference node;
  - a sixth resistor coupled between the second passive summing junction and the input of the second quantizer;
  - a fourth capacitor having a first terminal coupled to the input of the second quantizer and having a second terminal;
  - a seventh resistor coupled between the second terminal of the fourth capacitor and the supply voltage reference node;
  - a second inverting amplifier having an input coupled to the output of the second quantizer and having an output; and
  - an eighth resistor coupled between the output of the second inverting amplifier and the second passive summing junction.

7. The passive sigma-delta modulator of claim 6, wherein the analog amplifier has a gain of A and wherein the digital transfer circuitry comprises a digital amplifier having a gain of 1/A.

8. The passive sigma-delta modulator of claim 5, wherein the second modulator loop comprises:
- an analog amplifier having an input coupled to the input of the first quantizer and having an output;
- an analog noise cancelation filter having an input coupled to the output of the analog amplifier and having an output;
- a fifth resistor coupled between the output of the analog noise cancelation filter and the second passive summing junction;
- a third capacitor coupled between the second passive summing junction and the supply voltage reference node;
- a sixth resistor coupled between the second passive summing junction and the input of the second quantizer;
- a fourth capacitor having a first terminal coupled to the input of the second quantizer and having a second terminal;
- a seventh resistor coupled between the second terminal of the fourth capacitor and the supply voltage reference node;
- a second inverting amplifier having an input coupled to the output of the second quantizer and having an output; and
- an eighth resistor coupled between the output of the second inverting amplifier and the second passive summing junction.

9. The passive sigma-delta modulator of claim 8, wherein the analog amplifier has a gain of A and wherein the digital transfer circuitry comprises a digital amplifier having a gain of 1/A.

10. The passive sigma-delta modulator of claim 5, further comprising:
- a digital noise cancelation filter located between the output of the first quantizer and the first input of the digital combiner; and
- wherein the second modulator loop comprises:
  - an analog amplifier having an input coupled to the first passive summing junction and having an output;
  - a fifth resistor coupled between the output of the analog amplifier and the second passive summing junction;
  - a third capacitor coupled between the second passive summing junction and the supply voltage reference node;
  - a sixth resistor coupled between the second passive summing junction and the input of the second quantizer;
  - a fourth capacitor having a first terminal coupled to the input of the second quantizer and having a second terminal;
  - a seventh resistor coupled between the second terminal of the fourth capacitor and the supply voltage reference node;
  - a second inverting amplifier having an input coupled to the output of the second quantizer and having an output; and
  - an eighth resistor coupled between the output of the second inverting amplifier and the second passive summing junction.

11. The passive sigma-delta modulator of claim 10, wherein the analog amplifier has a gain of A and wherein the digital transfer circuitry comprises a digital amplifier having a gain of 1/A.

12. The passive sigma-delta modulator of claim 5, wherein the second modulator loop comprises:
- an analog amplifier having an input coupled to the first passive summing junction and having an output;
- an analog noise cancelation filter having an input coupled to the output of the analog amplifier and having an output;
- a fifth resistor coupled between the output of the analog noise cancelation filter and the second passive summing junction;
- a third capacitor coupled between the second passive summing junction and the supply voltage reference node;
- a sixth resistor coupled between the second passive summing junction and the input of the second quantizer;
- a fourth capacitor having a first terminal coupled to the input of the second quantizer and having a second terminal;
- a seventh resistor coupled between the second terminal of the fourth capacitor and the supply voltage reference node;
- a second inverting amplifier having an input coupled to the output of the second quantizer and having an output; and
- an eighth resistor coupled between the output of the second inverting amplifier and the second passive summing junction.

13. The passive sigma-delta modulator of claim 12, wherein the analog amplifier has a gain of A and wherein the digital transfer circuitry comprises a digital amplifier having a gain of 1/A.

14. The passive sigma-delta modulator of claim 5, wherein:
- the second modulator loop comprises:
  - an analog amplifier having an input coupled to the input of the first quantizer and having an output;

a fifth resistor having a first terminal coupled to the output of the analog amplifier and having a second terminal;
a sixth resistor coupled between the second terminal of the fifth resistor and the second passive summing junction;
a seventh resistor coupled between the second passive summing junction and the input of the second quantizer;
a third capacitor coupled between the second terminal of the fifth resistor and the supply voltage reference node;
a fourth capacitor coupled between the second terminal of the fifth resistor and the second passive summing junction;
a fifth capacitor having a first terminal coupled to the input of the second quantizer and having a second terminal;
an eighth resistor coupled between the second terminal of the fifth capacitor and the supply voltage reference node;
a second inverting amplifier having an input coupled to the output of the second quantizer and having an output;
a ninth resistor having a first terminal coupled to the output of the second inverting amplifier and having a second terminal;
a sixth capacitor having a first terminal coupled to the second terminal of the ninth resistor and having a second terminal;
a tenth resistor coupled between the second terminal of the sixth capacitor and a supply node providing a supply voltage; and
an eleventh resistor coupled between the first terminal of the sixth capacitor and the second passive summing junction; and
wherein the analog amplifier has a gain of A and wherein the digital transfer circuitry comprises a digital amplifier having a gain of 1/A.

15. The passive sigma-delta modulator of claim 5, wherein:
the second modulator loop comprises:
an analog amplifier having an input coupled to the first passive summing junction and having an output;
a fifth resistor having a first terminal coupled to the output of the analog amplifier and having a second terminal;
a sixth resistor coupled between the second terminal of the fifth resistor and the second passive summing junction;
a seventh resistor coupled between the second passive summing junction and the input of the second quantizer;
a third capacitor coupled between the second terminal of the fifth resistor and the supply voltage reference node;
a fourth capacitor coupled between the second terminal of the fifth resistor and the second passive summing junction;
a fifth capacitor having a first terminal coupled to the input of the second quantizer and having a second terminal;
an eighth resistor coupled between the second terminal of the fifth capacitor and the supply voltage reference node;
a second inverting amplifier having an input coupled to the output of the second quantizer and having an output;
a ninth resistor having a first terminal coupled to the output of the second inverting amplifier and having a second terminal;
a sixth capacitor having a first terminal coupled to the second terminal of the ninth resistor and having a second terminal;
a tenth resistor coupled between the second terminal of the sixth capacitor and a supply node providing a supply voltage; and
an eleventh resistor coupled between the first terminal of the sixth capacitor and the second passive summing junction; and
wherein the analog amplifier has a gain of A and wherein the digital transfer circuitry comprises a digital amplifier having a gain of 1/A.

16. The passive sigma-delta modulator of claim 5, further comprising:
a digital noise cancelation filter located between the output of the first quantizer and the first input of the digital combiner;
wherein the second modulator loop comprises:
a transconductance amplifier having an input coupled to the first passive summing junction and having an output coupled to the second passive summing junction;
a third capacitor coupled between the second passive summing junction and the supply voltage reference node;
a fifth resistor coupled between the second passive summing junction and the input of the second quantizer;
a fourth capacitor having a first terminal coupled to the input of the second quantizer and having a second terminal;
a sixth resistor coupled between the second terminal of the fourth capacitor and the supply voltage reference node;
a second inverting amplifier having an input coupled to the output of the second quantizer and having an output; and
an eighth resistor coupled between the output of the second inverting amplifier and the second passive summing junction; and
wherein the transconductance amplifier has a transconductance proportional to a gain value A and wherein the digital transfer circuitry comprises a digital amplifier having a gain of 1/A.

17. The passive sigma-delta modulator of claim 5, wherein:
the second modulator loop comprises:
a transconductance amplifier having an input coupled to the first passive summing junction and having an output coupled to the second passive summing junction;
a fifth resistor having a first terminal coupled to the second passive summing junction and having a second terminal;
a third capacitor having a first terminal coupled to the second terminal of the fifth resistor and having a second terminal coupled to the first passive summing junction;
a sixth resistor coupled between the second passive summing junction and the input of the second quantizer;

a fourth capacitor coupled between the second passive summing junction and the supply voltage reference node;

a fifth capacitor having a first terminal coupled to the input of the second quantizer and having a second terminal;

a seventh resistor coupled between the second terminal of the fifth capacitor and the supply voltage reference node;

a second inverting amplifier having an input coupled to the output of the second quantizer and having an output;

an eighth resistor having a first terminal coupled to the output of the second inverting amplifier and having a second terminal;

a sixth capacitor having a first terminal coupled to the second terminal of the eighth resistor and having a second terminal;

a ninth resistor coupled between the second terminal of the sixth capacitor and a supply node providing a supply voltage; and a tenth resistor coupled between the first terminal of the sixth capacitor and the second passive summing junction; and wherein the transconductance amplifier has a transconductance proportional to a gain value A and wherein the digital transfer circuitry comprises a digital amplifier having a gain of 1/A.

18. The passive sigma-delta modulator of claim 5, further comprising:

a digital noise cancelation filter located between the output of the first quantizer and the first input of the digital combiner; and wherein the second modulator loop comprises:
  a fifth resistor coupled between the first passive summing junction and the second passive summing junction;

a third capacitor coupled between the second passive summing junction and the supply voltage reference node;

a sixth resistor coupled between the second passive summing junction and the input of the second quantizer;

a fourth capacitor having a first terminal coupled to the input of the second quantizer and having a second terminal;

a seventh resistor coupled between the second terminal of the fourth capacitor and the supply voltage reference node;

a second inverting amplifier having an input coupled to the output of the second quantizer and having an output; and an eighth resistor coupled between the output of the second inverting amplifier and the second passive summing junction.

19. The passive sigma-delta modulator of claim 5, wherein the second modulator loop comprises:

a fifth resistor having a first terminal coupled to the first passive summing junction and having a second terminal;

a sixth resistor coupled between the second terminal of the fifth resistor and the second passive summing junction;

a third capacitor coupled between the second terminal of the fifth resistor and the supply voltage reference node;

a fourth capacitor coupled between the second passive summing junction and the supply voltage reference node;

a fifth capacitor coupled between the second passive summing junction and the second terminal of the fifth resistor;

a seventh resistor coupled between the second passive summing junction and the input of the second quantizer;

a sixth capacitor having a first terminal coupled to the input of the second quantizer and having a second terminal;

an eighth resistor coupled between the second terminal of the fourth capacitor and the supply voltage reference node;

a second inverting amplifier having an input coupled to the output of the second quantizer and having an output; and an eighth resistor coupled between the output of the second inverting amplifier and the second passive summing junction.

20. The passive sigma-delta modulator of claim 5, wherein the second modulator loop comprises:

a fifth resistor having a first terminal coupled to the first passive summing junction and having a second terminal;

a sixth resistor coupled between the second terminal of the fifth resistor and the second passive summing junction;

a seventh resistor coupled between the second passive summing junction and the input of the second quantizer;

a third capacitor coupled between the second terminal of the fifth resistor and the supply voltage reference node;

a fourth capacitor coupled between the second terminal of the fifth resistor and the second passive summing junction;

a fifth capacitor having a first terminal coupled to the input of the second quantizer and having a second terminal;

an eighth resistor coupled between the second terminal of the fifth capacitor and the supply voltage reference node;

a second inverting amplifier having an input coupled to the output of the second quantizer and having an output;

a ninth resistor having a first terminal coupled to the output of the second inverting amplifier and having a second terminal;

a sixth capacitor having a first terminal coupled to the second terminal of the ninth resistor and having a second terminal;

a tenth resistor coupled between the second terminal of the sixth capacitor and a supply node providing a supply voltage; and an eleventh resistor coupled between the first terminal of the sixth capacitor and the second passive summing junction.

* * * * *